(12) United States Patent
Sakaue et al.

(10) Patent No.: US 10,054,798 B2
(45) Date of Patent: Aug. 21, 2018

(54) LIGHT-EMITTING DEVICE

(71) Applicant: Sharp Kabushiki Kaisha, Sakai (JP)

(72) Inventors: Tomohiro Sakaue, Sakai (JP); Koji Takahashi, Sakai (JP); Yoshiyuki Takahira, Sakai (JP); Yosuke Maemura, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 191 days.

(21) Appl. No.: 15/266,188

(22) Filed: Sep. 15, 2016

(65) Prior Publication Data

US 2017/0003001 A1 Jan. 5, 2017

Related U.S. Application Data

(63) Continuation of application No. 14/264,325, filed on Apr. 29, 2014, now Pat. No. 9,470,895.

(30) Foreign Application Priority Data

Jun. 18, 2013 (JP) .................................. 2013-127871

(51) Int. Cl.
*F21V 9/30* (2018.01)
*G02B 27/09* (2006.01)
(Continued)

(52) U.S. Cl.
CPC ............ *G02B 27/0927* (2013.01); *F21K 9/61* (2016.08); *F21K 9/64* (2016.08); *F21S 41/14* (2018.01); *F21S 41/16* (2018.01); *F21S 41/24* (2018.01); *F21S 41/285* (2018.01); *F21S 41/39* (2018.01); *F21V 9/30* (2018.02); *G02B 27/0994* (2013.01);
(Continued)

(58) Field of Classification Search
CPC .... F21K 9/61; F21K 9/64; F21S 41/14; F21S 41/16; F21S 41/24; F21S 41/39; F21S 41/285; F21S 45/47; F21V 9/30; F21Y 2101/00; F21Y 2115/10; F21Y 2115/30;
(Continued)

(56) References Cited

U.S. PATENT DOCUMENTS 5,655,832 A 8/1997 Pelka et al.
6,272,269 B1 8/2001 Naum
(Continued)

FOREIGN PATENT DOCUMENTS

EP 2 518 838 10/2012
JP 11-195303 7/1999
(Continued)

OTHER PUBLICATIONS

Takahira et al., U.S. Office Action dated Nov. 30, 2016, directed to U.S. Appl. No. 13/744,238; 12 pages.
(Continued)

*Primary Examiner* — Stephen F Husar
(74) *Attorney, Agent, or Firm* — Morrison & Foerster LLP

(57) ABSTRACT

A light-emitting device includes a light-emitting portion that emits fluorescence in response to excitation light incident on a surface of the light-emitting portion, and a reflector that defines a light-emitting region on the surface of the light-emitting portion, the fluorescence being emitted from the light-emitting region. The excitation light has a top-hat energy intensity distribution on the surface of the light-emitting portion.

3 Claims, 11 Drawing Sheets

(51) Int. Cl.

| | |
|---|---|
| *F21K 9/61* | (2016.01) |
| *F21K 9/64* | (2016.01) |
| *F21S 41/14* | (2018.01) |
| *F21S 41/20* | (2018.01) |
| *F21S 41/24* | (2018.01) |
| *F21S 41/39* | (2018.01) |
| *F21S 41/16* | (2018.01) |
| *F21Y 101/00* | (2016.01) |
| *F21Y 115/30* | (2016.01) |
| *H01S 5/00* | (2006.01) |
| *F21Y 115/10* | (2016.01) |
| *F21S 45/47* | (2018.01) |

(52) U.S. Cl.
CPC ........... *F21S 45/47* (2018.01); *F21Y 2101/00* (2013.01); *F21Y 2115/10* (2016.08); *F21Y 2115/30* (2016.08); *H01S 5/0064* (2013.01)

(58) Field of Classification Search
CPC ............ G02B 27/0927; G02B 27/0994; H01S 5/0064
See application file for complete search history.

(56) References Cited

U.S. PATENT DOCUMENTS

| | | | |
|---|---|---|---|
| 7,684,668 B2 | 3/2010 | Cianciotto et al. | |
| 7,830,473 B2 | 11/2010 | Furuya et al. | |
| 8,831,396 B1 | 9/2014 | Price et al. | |
| 9,223,071 B2* | 12/2015 | Takahira | G02B 6/0003 |
| 9,470,895 B2* | 10/2016 | Sakaue | G02B 27/0994 |
| 2002/0191160 A1 | 12/2002 | Chuang | |
| 2003/0086066 A1 | 5/2003 | Kato | |
| 2004/0130896 A1 | 7/2004 | Brown et al. | |
| 2004/0233675 A1 | 11/2004 | Meguro et al. | |
| 2004/0252281 A1 | 12/2004 | Fischer et al. | |
| 2005/0105301 A1 | 5/2005 | Takeda et al. | |
| 2007/0242924 A1 | 10/2007 | Cianciotto et al. | |
| 2008/0080207 A1 | 4/2008 | Specht et al. | |
| 2008/0089089 A1 | 4/2008 | Hama et al. | |
| 2009/0003400 A1 | 1/2009 | Nagahama et al. | |
| 2010/0118535 A1 | 5/2010 | Kusukame et al. | |
| 2011/0148280 A1 | 6/2011 | Kishimoto et al. | |
| 2011/0157865 A1 | 6/2011 | Takahashi et al. | |
| 2011/0194302 A1 | 8/2011 | Kishimoto et al. | |
| 2011/0216286 A1 | 9/2011 | Matsumoto et al. | |
| 2011/0216550 A1 | 9/2011 | Koike et al. | |
| 2011/0279999 A1 | 11/2011 | Takahashi | |
| 2011/0280039 A1 | 11/2011 | Kishimoto | |
| 2012/0031883 A1 | 2/2012 | Kumamoto et al. | |
| 2012/0133904 A1 | 5/2012 | Akiyama | |
| 2012/0206031 A1 | 8/2012 | Nakazato et al. | |
| 2012/0236264 A1 | 9/2012 | Akiyama | |
| 2013/0088471 A1 | 4/2013 | Kitano | |
| 2013/0182452 A1 | 7/2013 | Takahira et al. | |

FOREIGN PATENT DOCUMENTS

| | | |
|---|---|---|
| JP | 2004-241142 | 8/2004 |
| JP | 2005-56608 | 3/2005 |
| JP | 2006-350255 | 12/2006 |
| JP | 2007-323858 | 12/2007 |
| JP | 2010-232044 | 10/2010 |
| JP | 2011/121082 | 6/2011 |
| JP | 2011-165521 | 8/2011 |
| JP | 2011-181381 | 9/2011 |
| JP | 2011-222260 | 11/2011 |
| JP | 2011-243373 | 12/2011 |
| JP | 2012-089316 | 5/2012 |
| JP | 2012-99222 | 5/2012 |
| JP | 2012-169050 | 9/2012 |
| JP | 2012-195064 | 10/2012 |
| JP | 2012-222050 | 11/2012 |
| JP | 2013-92752 | 5/2013 |
| WO | WO-2006/038502 | 4/2006 |
| WO | WO-2010/058323 | 5/2010 |
| WO | WO-2010/061684 | 6/2010 |
| WO | WO-2010/137475 | 12/2010 |
| WO | WO-2011/099640 | 8/2011 |
| WO | WO-2011/135534 | 11/2011 |
| WO | WO-2012/005686 | 1/2012 |

OTHER PUBLICATIONS

Takahira et al. Office Action dated Dec. 29, 2017, directed to U.S. Appl. No. 13/744,238; 14 pages.

Takahira et al., U.S. Office Action dated Apr. 14, 2017, directed to U.S. Appl. No. 13/744,238; 15 pages.

Extended Search Report dated Mar. 13, 2018, directed to EP Application No. 13000197.7; 4 pages.

Takahira et al., U.S. Office Action dated Aug. 18, 2016, directed to U.S. Appl. No. 13/744,238; 13 pages.

Takahira et al., U.S. Office Action dated Nov. 6, 2014, directed to U.S. Appl. No. 13/744,238; 21 pages.

Takahira et al., U.S. Office Action dated Apr. 16, 2015, directed to U.S. Appl. No. 13/744,238; 18 pages.

Takahira et al., U.S. Office Action dated Jul. 29, 2015, directed to U.S. Appl. No. 13/744,238; 13 pages.

Takahira et al., U.S. Office Action dated Dec. 22, 2015, directed to U.S. Appl. No. 13/744,238; 14 pages.

MacGregor, A. (Jan. 2015). "Industrial Applications of Laser Profiling," located at <http://www.photonics.com/Article.aspx?AID=57146> visited on Jul. 22, 2015. (8 pages).

Takahira et al., Advisory Action dated Jul. 9, 2015, directed to U.S. Appl. No. 13/744,238; 4 pages.

Takahira et al., U.S. Office Action dated Mar. 25, 2016, directed to U.S. Appl. No. 13/744,238; 13 pages.

* cited by examiner

EXCITATION LIGHT L1

ROD DIAMETER r: 0.4 mm
ROD LENGTH w: 20 mm

LIGHT-EMITTING DEVICE

CROSS-REFERENCE TO RELATED APPLICATION

This application is a continuation application of U.S. patent application Ser. No. 14/264,325, filed Apr. 29, 2014, now U.S Pat. No. 9,470,895, which is a non-provisional application claiming priority to Japanese Patent Application No. 2013-127871 filed on Jun. 18, 2013, the entire contents of which are hereby incorporated by reference.

FIELD OF THE INVENTION

The present disclosure relates to a light-emitting device including an excitation light source that emits excitation light and a light-emitting unit that emits fluorescence in response to the excitation light.

BACKGROUND OF THE INVENTION

Light-emitting devices including an excitation light source that emits excitation light and a light-emitting unit that emits fluorescence in response to the excitation light have been developed.

An example of a light-emitting device is a light source device described in Japanese Unexamined Patent Application Publication No. 2012-89316 (published May 10, 2012). The light source device includes a solid light source that emits excitation light and a phosphor layer that emits fluorescence when excited by the excitation light emitted from the solid light source. The fluorescence emitted from the phosphor layer is used as illumination light. In this light source device, the shape and cross-sectional area of the excitation light beam on the incident surface of the phosphor layer are substantially the same as the shape and area of the entire incident surface of the phosphor layer. Since a sufficient amount of excitation light is incident on the incident surface of the phosphor layer over substantially the entire area thereof, the illumination light, in which the excitation light and the fluorescence are mixed at a certain ratio, is emitted from substantially the entire area of the incident surface of the phosphor layer.

However, in the light source device according to Japanese Unexamined Patent Application Publication No. 2012-89316, the intensity of the excitation light on the phosphor layer is not uniform. The intensity of the excitation light has, for example, a Gaussian distribution on the phosphor layer. This leads to the following problems.

Firstly, in the case where the intensity of the excitation light on the phosphor layer is not uniform, the intensity of the fluorescence emitted from the phosphor layer excited by the excitation light is also not uniform. Therefore, fluorescence having a nonuniform brightness distribution is emitted from the phosphor layer. Secondly, the phosphor layer receives a large amount of energy from the excitation light in a region where the intensity of the excitation light incident on the phosphor layer is the highest, and the temperature becomes high in that region as a result. Accordingly, temperature quenching and/or deterioration of the phosphor occur in that region, and the intensity of the fluorescence emitted from the phosphor decreases. As a result, the brightness distribution of the fluorescence emitted from the phosphor layer becomes nonuniform. Lastly, when the position of incidence of the excitation light on the phosphor layer is displaced or shifted, the intensity distribution of the fluorescence on the phosphor layer changes. In such a case, the intensity distribution and the shape of the fluorescence emitted to the outside from the light source device also change. This also makes the brightness distribution of the fluorescence nonuniform.

SUMMARY OF THE INVENTION

In view of the above-described problems, the present disclosure provides a light-emitting device capable of improving the uniformity of the brightness distribution of the fluorescence.

A light-emitting device according to an aspect of the present disclosure includes a light-emitting unit that emits fluorescence in response to excitation light incident on a surface of the light-emitting unit, and a light-emitting-region defining portion that defines a light-emitting region on the surface of the light-emitting unit, the fluorescence being emitted from the light-emitting region. The excitation light has a top-hat energy intensity distribution on the surface of the light-emitting unit.

DETAILED DESCRIPTION OF THE INVENTION

An embodiment of the present disclosure will now be described in detail with reference to FIGS. 1A to 3.

Structure of Light-Emitting Device 1

Figure 2:
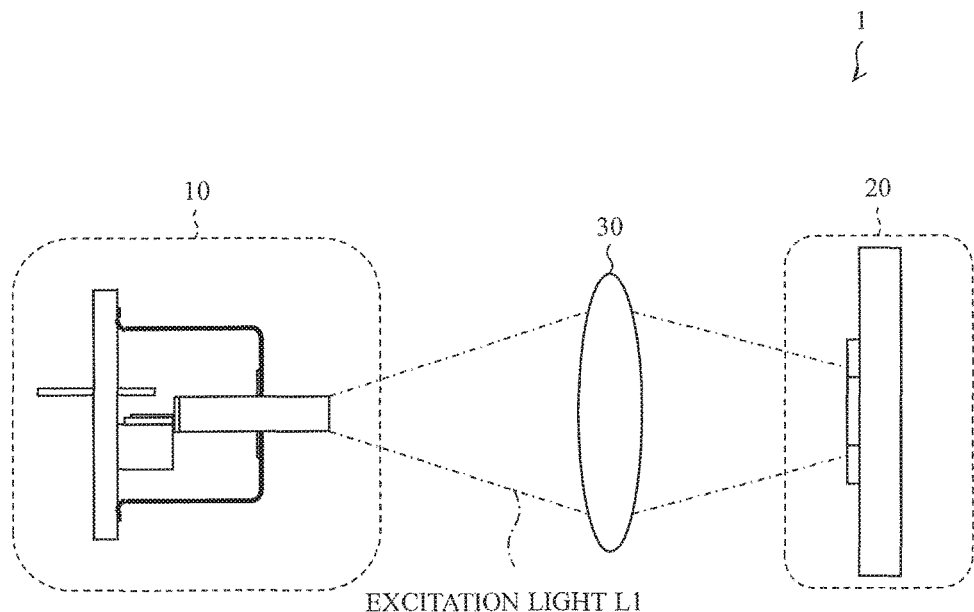
FIG. 2 is a schematic diagram illustrating the structure of the light-emitting device including the light-emitting unit illustrated in FIGS. 1A and 1B.

First, the structure of a light-emitting device 1 according to the present embodiment will be described with reference to FIG. 2. FIG. 2 is a schematic diagram illustrating the structure of the light-emitting device 1. As illustrated in FIG. 2, the light-emitting device 1 includes a laser unit 10, a light-emitting unit 20, and an optical member 30.

The laser unit 10 emits excitation light L1 having a wavelength of about 405 nm toward the light-emitting unit 20. The light-emitting unit 20 receives the excitation light L1 and emits fluorescence having a longer wavelength than that of the excitation light L1. The optical member 30 is a convex lens disposed between the laser unit 10 and the light-emitting unit 20. The optical member 30 focuses the excitation light L1 emitted from the laser unit 10 on a phosphor layer 23 (see FIG. 1A) provided on a surface of the light-emitting unit 20. The excitation light L1 incident on the phosphor layer 23 is absorbed by phosphor contained in the phosphor layer 23, and is thereby converted into fluorescence. The fluorescence is emitted from the surface of the light-emitting unit 20.

Figure 3:
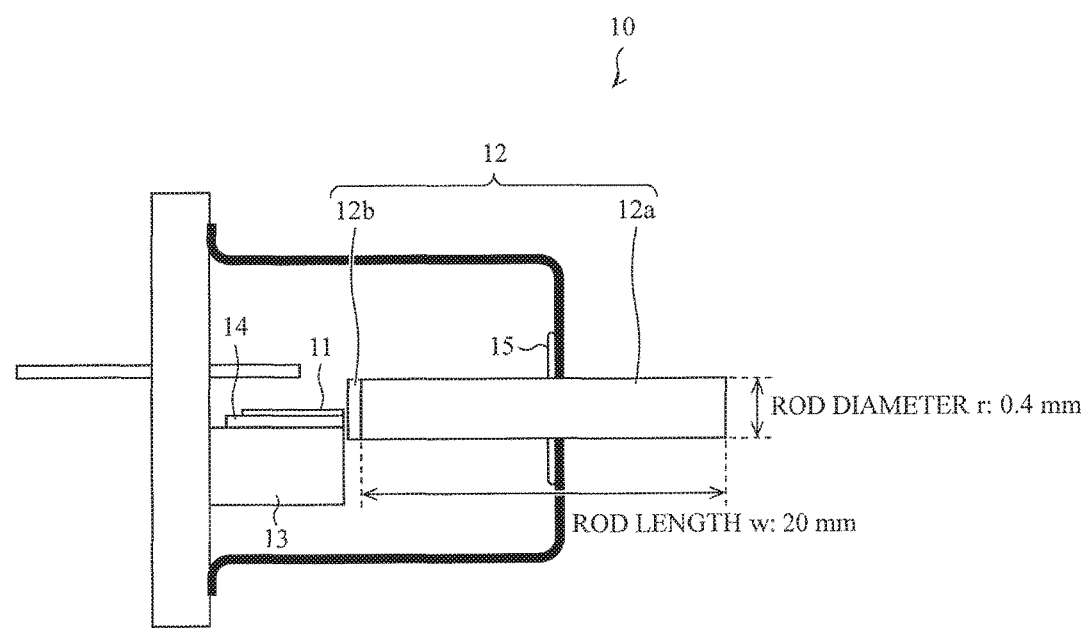
FIG. 3 is a sectional view of a laser unit included in the light-emitting device illustrated in FIG. 2.

The detailed structure of the laser unit 10 will now be described with reference FIG. 3. FIG. 3 is a sectional view of the laser unit 10.

As illustrated in FIG. 3, the laser unit 10 includes a laser chip (excitation light source) 11 and a light guide 12. The laser chip 11 emits the excitation light L1 toward an incident end face of the light guide 12. The laser chip 11 is placed on a sub-mount 14 on a stem 13 disposed in the laser unit 10.

The light guide 12 includes a rod lens 12a and an anti-reflection (AR) coating film 12b. The rod lens 12a is a rod-shaped optical member made of glass, and guides the excitation light L1 emitted from the laser chip 11 in a length direction of the rod lens 12a, that is, toward the light-emitting unit 20 in FIG. 2. The position and orientation of the rod lens 12a are fixed by a low-melting glass member 15. The rod lens 12a has a length w of 20 mm. The cross section of the rod lens 12a along a plane perpendicular to the direction of the length w is a square, each side of which has a length r of 0.4 mm. The cross-sectional shape of the rod lens 12a is designed to be similar to the shape of the top surface of the phosphor layer 23 (see FIG. 1A).

The excitation light L1 has a spatially nonuniform intensity distribution, such as Gaussian distribution, on the incident end face of the rod lens 12a. However, the excitation light L1 is totally reflected many times in the rod lens 12a as it travels through the rod lens 12a, and has a uniform intensity distribution (see FIG. 1B) on an emission end face of the rod lens 12a. The spatially uniform intensity distribution is called a top-hat intensity distribution. The definition of the top-hat distribution will be described in detail at the end of this embodiment.

The incident end face of the rod lens 12a is coated with the AR coating film 12b. Accordingly, the excitation light L1 emitted from the laser chip 11 and incident on the rod lens 12a is prevented from being reflected instead of entering the rod lens 12a.

Figure 1A:
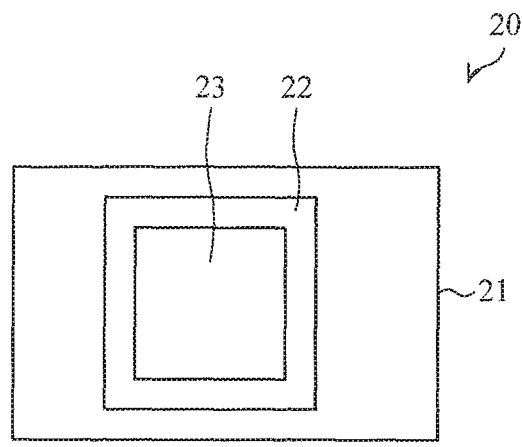
FIGS. 1A and 1B are a top view and a sectional view, respectively, of a light-emitting unit included in a light-emitting device according to an embodiment of the present disclosure.
Figure 1B:
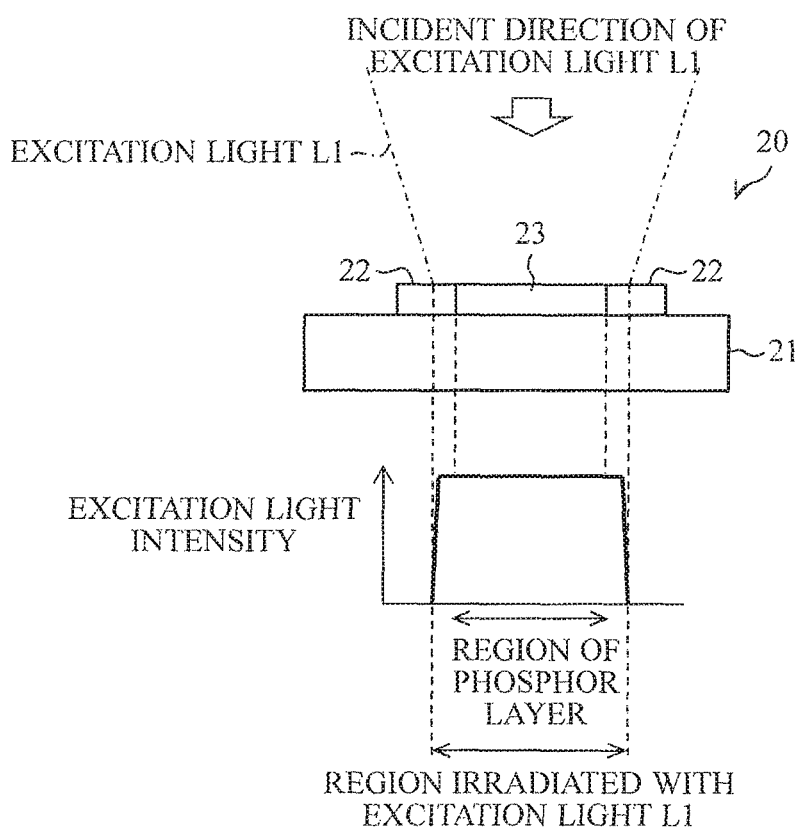

The structure of the light-emitting unit 20 will now be described with reference to FIGS. 1A and 1B. FIGS. 1A and 1B are a top view and a side view, respectively, of the light-emitting unit 20. As illustrated in FIGS. 1A and 1B, the light-emitting unit 20 includes a reflective substrate 21, a reflector (light-emitting-region defining portion, blocking portion) 22, and the phosphor layer 23. As illustrated in FIG. 1B, the reflector 22 and the phosphor layer 23 are provided on the reflective substrate 21.

The reflective substrate 21 may be formed of a material having a high visible-light reflectance. Alternatively, the reflective substrate 21 may have a surface having a high visible-light reflectance. The reflective substrate 21 may be, for example, a metal plate. Alternatively, the reflective substrate 21 may be a quartz plate having a metal deposited on a surface thereof. The reflective substrate 21 may be composed of a metal having a low thermal resistance so that heat from the phosphor layer 23 can be efficiently dissipated.

The reflector 22 is formed by applying, by using a dispenser or the like, a material that reflects visible light to an area around the phosphor layer 23 formed on the reflective substrate 21. The reflector 22 is not limited as long as it is formed in the area around the phosphor layer 23 so that the front surface of the phosphor layer 23 has the shape of the desired light emission pattern. The material of the reflector 22 may be, for example, a white pigment or a ceramic material. The reflector 22 is capable of reflecting the fluorescence emitted from side surfaces of the phosphor layer 23 toward the inside of the phosphor layer 23. Thus, the fluorescence emitted from the side surfaces of the phosphor layer 23 is prevented from being reflected by the reflective substrate 21, and projected toward the outside of the light-emitting device 1. In a modification of the present embodiment, the light-emitting unit 20 may include an absorber that absorbs the excitation light L1 and the fluorescence instead of the reflector 22. The absorber may be composed of, for example, a black pigment or a ceramic material.

As illustrated in FIG. 1A, the reflector 22 is formed along the entire periphery of the phosphor layer 23. As illustrated in FIG. 1B, the height of the front surface of the reflector 22 may be the same as that of the front surface of the phosphor layer 23. Thus, the front surface of the reflector 22 and the front surface of the phosphor layer 23 form a single surface. Therefore, in the case where the excitation light L1 is obliquely incident on the front surface of the phosphor layer 23 (see FIG. 13), the phosphor layer 23 is not located behind the reflector 22 as viewed in the direction in which the excitation light L1 is incident. In other words, the excitation light L1 can be incident on the phosphor layer 23 without being blocked by the reflector 22. However, the height of the front surface of the reflector 22 from the reflective substrate 21 is not limited as long as it is greater than or equal to the height of the front surface of the phosphor layer 23 from the reflective substrate 21.

The phosphor layer 23 contains a plurality of phosphors that absorb the excitation light L1 and emit fluorescence. The phosphors contained in the phosphor layer 23 are selected so that white light is generated when colors of fluorescence emitted from the respective phosphors are mixed. For example, the phosphors may be a combination of a phosphor that emits blue fluorescence and a phosphor that emits yellow fluorescence, or a combination of a phosphor that emits blue fluorescence, a phosphor that emits green fluorescence, and a phosphor that emits red fluorescence. The types of the phosphors contained in the phosphor layer 23 are not particularly limited, and may be selected as appropriate. For example, the phosphor layer 23 may contain BAM that emits blue light, β-SiAlON that emits green light, and CASN that emits red light. In this case, white light is generated when the colors of fluorescence emitted from the phosphor layer 23 are mixed. Thus, the light-emitting device 1 is capable of emitting white light.

As illustrated in FIG. 1A, the phosphor layer 23 is formed so that the top surface thereof, that is, the surface on which the excitation light L1 is incident, has a square shape. The top surface of the phosphor layer 23 only has linear sides, and the corners thereof are not rounded. In addition, as illustrated in FIG. 1B, the phosphor layer 23 has a constant thickness, and the corners between the top surface and the side surfaces thereof are sharp. Since the phosphor layer 23 has such a structure, the light-emitting unit 20 is capable of emitting light in a pattern having a substantially perfect square shape. The shape of the top surface of the phosphor layer 23 is not limited to a square, and may be any shape. The shape of the top surface of the phosphor layer 23 defines the light emission pattern of the fluorescence.

The details of the optical member 30 will now be described with reference to FIG. 1B.

As described above, the optical member 30 focuses the excitation light L1 on the phosphor layer 23. More specifically, the optical member 30 focuses the excitation light L1 so that the beam of the excitation light L1 that is incident on the top surface of the phosphor layer 23 is slightly greater than the top surface of the phosphor layer 23. The beam shape of the excitation light L1 on the top surface of the phosphor layer 23 is determined by the shape of the emission end face of the rod lens 12a. As described above, the shape of the emission end face of the rod lens 12a is similar to the shape of the top surface of the phosphor layer 23 (square). Therefore, the beam shape of the excitation light L1 is also similar to the shape of the top surface of the phosphor layer 23.

Since the beam of the excitation light L1 incident on the top surface of the phosphor layer 23 is larger than the top surface of the phosphor layer 23, even when the position of incidence of the excitation light L1 is somewhat displaced due to, for example, vibration of the laser unit 10, the top surface of the phosphor layer 23 can be irradiated with the excitation light L1 over the entire area thereof.

In addition, since the shape of the top surface of the phosphor layer 23 and the shape of the beam of the excitation light L1 are both square, the margin for allowing the displacement of the position of incidence of the excitation light L1 (gap between the outline of the beam and the outline of the phosphor layer 23) can be made uniform in all directions. Accordingly, the margin allows the position of incidence of the excitation light L1 to be displaced in any direction along the top surface of the phosphor layer 23.

The optical member 30 focuses the excitation light L1 so that the top surface of the phosphor layer 23 is irradiated with the excitation light L1 over the entire area thereof. Therefore, the fluorescence emitted from the phosphor layer 23 has a light emission pattern defined by the shape of the top surface of the phosphor layer 23. In addition, the following effects can be expected.

In the case where the excitation light L1 incident on the phosphor layer 23 travels through the phosphor layer 23 and then excites a phosphor at a certain position in the phosphor layer 23, the fluorescence generated by the phosphor is emitted from the top surface of the phosphor layer 23 at that position. Since the optical member 30 focuses the excitation light L1 so that the top surface of the phosphor layer 23 is irradiated with the excitation light L1 over the entire area thereof, the fluorescence forms the light emission pattern irrespective of the position at which the fluorescence is emitted. Therefore, the light emission pattern is not deformed irrespective of the position at which the fluorescence is emitted from the top surface of the phosphor layer 23.

As described above, the excitation light L1 has a uniform intensity distribution on the emission end face of the rod lens 12a. Therefore, the excitation light L1 also has a uniform intensity distribution on the top surface of the phosphor layer 23, as illustrated in FIG. 1B. Accordingly, even when the position of incidence of the excitation light L1 on the top surface of the phosphor layer 23 is displaced due to, for example, vibration of the laser unit 10, the intensity of the excitation light L1 incident on the phosphor layer 23 does not change at each position of the phosphor layer 23. As a result, the intensity of the fluorescence emitted from the phosphor layer 23 also does not change at each position of the phosphor layer 23.

Since the light emission pattern of the phosphor layer 23 has a square shape, the shape of an image of the light emission pattern projected outward from the light-emitting device 1 is also square. In the case where the light-emitting device 1 includes a plurality of phosphor layers 23, light distribution patterns of various shapes other than a square can also be realized by superposing images of a plurality of light emission patterns outside the light-emitting device 1.

In the case where the light-emitting device 1 is assembled in a lighting device, to ensure eye safety, a filter that prevents the excitation light L1 reflected by the surface of the reflector 22 or the surface of the phosphor layer 23 from being projected outward from the light-emitting device 1, or a filter that blocks the excitation light L1, may be installed in the light-emitting device 1.

Figure 14:
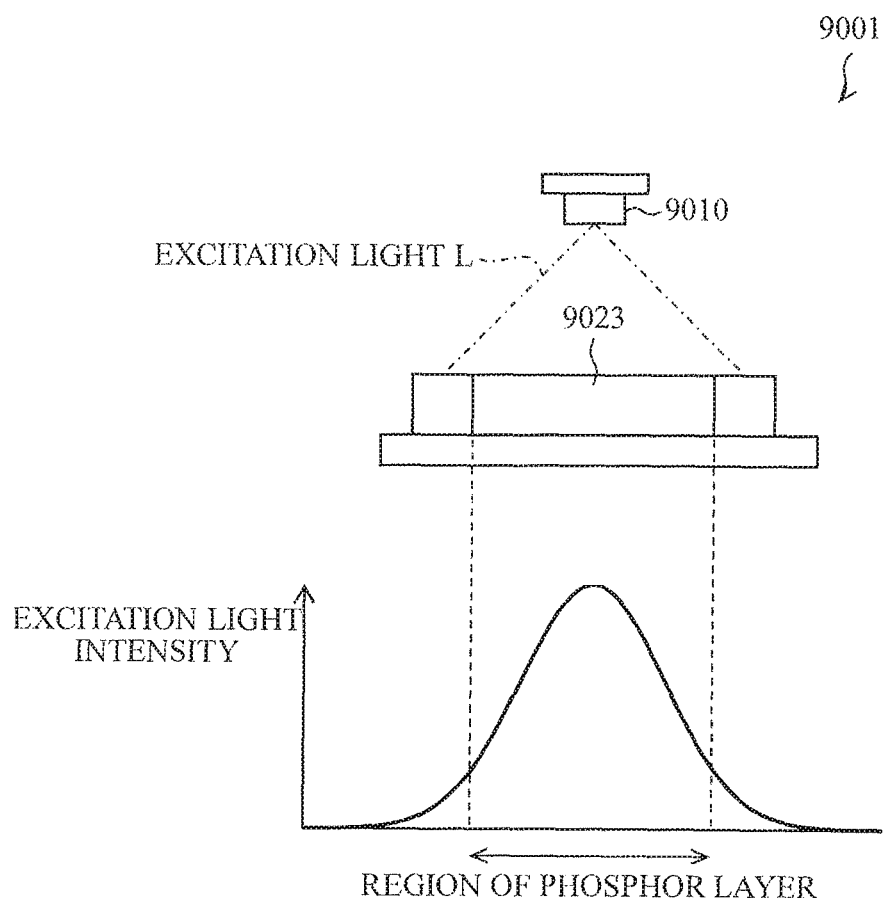
FIG. 14 is a schematic diagram illustrating the structure of a light-emitting device according to the related art.

Referring to FIG. 14, the light-emitting device 1 according to the present embodiment will be compared with a light-emitting device 9001 according to the related art. FIG. 14 is a schematic diagram illustrating the structure of the light-emitting device 9001 according to the related art.

As illustrated in FIG. 14, the light-emitting device 9001 includes an excitation light source 9010 that emits excitation light L and a phosphor layer 9023 that emits fluorescence in response to the excitation light L. In the light-emitting device 9001, when the excitation light source 9010 is a semiconductor laser, the spatial intensity distribution of the excitation light emitted from the excitation light source 9010 is a Gaussian distribution or another spatially nonuniform distribution.

As illustrated in FIG. 14, in the light-emitting device 9001, the intensity of the excitation light L has a Gaussian distribution on the top surface of the phosphor layer 9023. Therefore, the intensity of the energy applied to the phosphor at a location corresponding to the peak energy intensity of the excitation light L differs from that at a location corresponding to a tail of the Gaussian energy intensity distribution. As a result, the intensity distribution of the fluorescence emitted from the top surface of the phosphor layer 9023 becomes nonuniform. When the excitation light L having the Gaussian energy intensity distribution and the excitation light L1 having the top-hat energy intensity distribution have the same amount of light and the same beam width, the intensity of the excitation light L at the peak may be as high as about 5 times the intensity of the excitation light L1. Therefore, when the phosphor layer 9023 is irradiated with the excitation light L having the Gaussian energy intensity distribution, the temperature of the phosphor layer 9023 increases in the region where the excitation light L has a peak intensity, and the temperature quenching and/or deterioration of the phosphor occur in that region. As a result, the brightness of the fluorescence emitted from the phosphor layer 9023 changes.

In contrast, in the light-emitting device 1 according to the present embodiment, the excitation light L1 has a top-hat energy intensity distribution on the top surface of the phosphor layer 23. Therefore, the intensity of the excitation light L1 incident on the top surface of the phosphor layer 23 is uniform over the entire area of the top surface of the phosphor layer 23. As a result, the brightness of the fluorescence emitted from the phosphor layer 23 does not easily become nonuniform. In addition, since the intensity of the excitation light L1 incident on the phosphor layer 23 does not become high in a local region of the phosphor layer 23, there is no risk that a local temperature increase will occur. Therefore, temperature quenching and deterioration of the phosphors due to a temperature increase do not easily occur in the phosphor layer 23. As a result, the brightness of the fluorescence emitted from the phosphor layer 23 does not easily become nonuniform. Thus, a light emission pattern having a uniform brightness can be realized.

As is clear from the above, in the case where the light-emitting device 1 is used as a light source of a lighting device, light having a uniform brightness distribution can be projected. Since a laser beam is used as the excitation light L1 in the light-emitting device 1, it is particularly advantageous that light having a uniform brightness distribution can be projected. This will now be described in more detail.

Since a laser beam is used as the excitation light L1, the light-emitting device 1 is capable of emitting fluorescence having a higher energy density than a light-emitting device in which an LED or the like is used to emit the excitation light. Therefore, in the case where the luminous flux of the emitted fluorescence is constant, the area of the top surface of the phosphor layer 23 can be made smaller in the light-emitting device 1 in which a laser beam is used as the excitation light L1 than in the light-emitting device in which an LED is used to emit the excitation light. As a result, the area of the light emission pattern determined by the top surface of the phosphor layer 23 can also be made smaller in the light-emitting device 1.

In the case where an image obtained by magnifying the light emission pattern is projected outward, when the size of the image is constant, the magnification of the image is greater in the light-emitting device 1 in which a laser beam is used as the excitation light L1 than in the light-emitting device in which an LED is used to emit the excitation light. This means that, in the light-emitting device 1, if the brightness of the light emission pattern is not uniform, the brightness of the image formed by the light emission pattern becomes very nonuniform. However, in the light-emitting device 1 according to the present embodiment, the brightness of the light emission pattern can be made uniform, as described above. Therefore, the brightness of the image of the light emission pattern can also be made uniform.

In the light-emitting device 9001 according to the related art, when the output of a laser beam used as the excitation light L is increased, the temperature quenching and deterioration of the phosphors in the local region where the excitation light L has a peak intensity become more prominent. As a result, brightness saturation of the phosphor occurs. In addition, in the case where a plurality of types of phosphors are contained in the phosphor layer 9023, since the phosphors have different brightness saturation tendencies, the color of the light projected from the light-emitting device 9001 changes. In the case where the phosphor layer 9023 contains a single type of phosphor and the mixture of the fluorescence and the excitation light L in the visible range is projected, the ratio between the fluorescence and the excitation light L changes due to the brightness saturation of the phosphor. Therefore, also in this case, the color of the projected light changes. As a result, the color of the light emission pattern of the projected light becomes nonuniform.

In contrast, in the light-emitting device 1, even when the output of the laser beam used as the excitation light L1 is increased, the intensity of the excitation light L1 incident on the top surface of the phosphor layer 23 is uniform over the entire area of the top surface of the phosphor layer 23. Therefore, the possibility that temperature quenching or deterioration of the phosphors will occur in a local region of the phosphor layer 23 is low, and the color of the light emission pattern does not become nonuniform. Accordingly, the color of the image of the light emission pattern also does not become nonuniform. The light-emitting device 1 may be configured so as to project either the fluorescence emitted from a plurality of types of phosphors contained in the phosphor layer 23, or the mixture of the fluorescence emitted from the phosphor layer 23 and the excitation light L1 in a visible range.

As described above, the top-hat distribution is a distribution in which the energy intensity of the excitation light L is substantially uniform on the surface of the phosphor layer 23 irradiated with the excitation light L1. More specifically, the top-hat distribution may be defined as a distribution that satisfies the following conditions (1) and (2).

(1) The intensity of the excitation light L1 at any point in a central region of the beam is within a predetermined range, which may be, for example, 80% or more of the peak intensity of the excitation light L1.

(2) 75% or more of the total energy of the excitation light L1 is distributed in the central region of the beam.

Here, the "central region of the beam" is a region inside a loop formed by connecting points closest to the outer periphery of the beam among the points at which the intensity of the excitation light L1 is 80% or more of the peak intensity. The region other than the central region of the beam is called a peripheral region of the beam.

As described above, the top-hat distribution is defined as a distribution which has a region where the intensity of the excitation light L1 is substantially uniform on the top surface of the phosphor layer 23 irradiated with the excitation light L1, and in which most of the energy of the excitation light L1 is in the region where the intensity is uniform.

In the case where the excitation light L1 has a top-hat distribution on the top surface of the phosphor layer 23, the phosphors contained in the phosphor layer 23 are uniformly excited. Therefore, the uniformity of the brightness distribution of the fluorescence emitted from the phosphor layer 23 can be increased. In addition, since most of the energy of the excitation light L1 is collected in the region where the intensity is uniform, the fluorescence having a uniform brightness distribution can be efficiently generated.

The intensity of the excitation light L1 in the region in which the intensity is uniform is 80% or more of the peak intensity of the excitation light L1, and 75% or more of the total energy of the excitation light L1 is in the region in which the intensity is uniform. Therefore, in particular, in the case where the light-emitting device 1 is used as a light source of a headlight, a light projection pattern with a uniform brightness distribution, which a headlight is required to emit, can be efficiently generated by the light-emitting device 1.

A second embodiment of the present disclosure will now be described with reference to FIG. 4. For convenience of description, components having the same functions as those described in the above-described embodiment are denoted by the same reference numerals, and descriptions thereof are thus omitted.

In the light-emitting device 1 according to the above-described embodiment, the surface of the phosphor layer 23 on which the excitation light L1 is incident is the same as the surface of the phosphor layer 23 from which the fluorescence is emitted (see FIG. 2).

Figure 4:
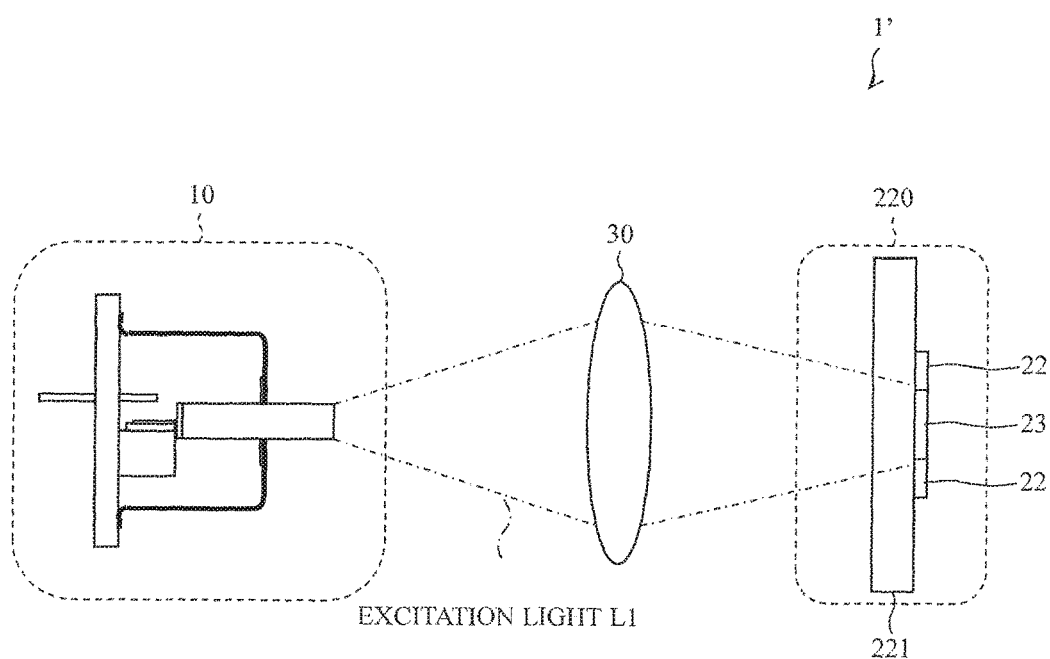
FIG. 4 is a schematic diagram illustrating the structure of a light-emitting device according to another embodiment of the present disclosure.

In contrast, as illustrated in FIG. 4, a light-emitting device 1' according to the present embodiment is structured such that a surface of a phosphor layer 23 on which excitation light L1 is incident (back surface) and a surface of the phosphor layer 23 from which fluorescence is emitted (front surface) are at opposite sides. In the light-emitting device 1', fluorescence emitted from a surface (front surface) at a side opposite to a surface (back surface) on which the excitation light L1 is incident is used.

As illustrated in FIG. 4, a light-emitting unit 220 may include a transparent substrate 221, which transmits the excitation light L1, and a phosphor layer 23 formed on the transparent substrate 221. Alternatively, the light-emitting unit 220 may instead be formed such that the phosphor layer 23 is secured by being supported by a support member at side surfaces thereof. The structure of the light-emitting unit 220 is not particularly limited as long as the excitation light L1 is incident on one surface of the phosphor layer 23 and the fluorescence is emitted from the opposite surface of the phosphor layer 23.

In the light-emitting device 1', a laser unit 10 and an optical member 30 are arranged such that they are not disposed in a region toward which the fluorescence is emitted from the phosphor layer 23. Therefore, the fluorescence emitted from the phosphor layer 23 is not blocked by the laser unit 10 or the optical member 30. In addition, a portion of the phosphor layer 23 that is irradiated with the excitation light L1, that is, a portion of the phosphor layer 23 that emits a maximum amount of heat, is in contact with the transparent substrate 221, so that the heat generated on the phosphor layer 23 can be efficiently dissipated through the transparent substrate 221. Therefore, the increase in temperature of the phosphor layer 23 can be suppressed.

Figure 5A:
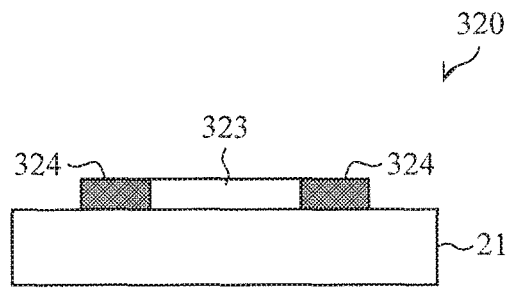
FIG. 5A is a sectional view of a light-emitting unit according to another embodiment of the present disclosure.

A third embodiment of the present disclosure will now be described with reference to FIGS. 5A to 5C. For convenience of description, components having the same functions as those described in the above-described embodiments are denoted by the same reference numerals, and descriptions thereof are thus omitted.

A light-emitting device 1 according to the present embodiment includes a light-emitting unit 320 instead of the light-emitting unit 20 in the structure illustrated in FIG. 2. In addition, a laser unit 10 emits excitation light L1 having a wavelength of about 450 nm. Other structures are the same as those in the first embodiment.

The structure of the light-emitting unit 320 will now be described with reference to FIG. 5A. FIG. 5A is a sectional view of the light-emitting unit 320. As illustrated in FIG. 5A, the light-emitting unit 320 includes a reflective substrate 21, an absorber (light-emitting-region defining portion, blocking portion) 324, and a phosphor layer 323.

The absorber 324 absorbs the excitation light L1 and fluorescence. The absorber 324 is formed so as to cover the entire areas of the side surfaces of the phosphor layer 323. Therefore, a portion of the excitation light L1 that is incident on the light-emitting unit 320 at a position deviated from the top surface of the phosphor layer 323 is absorbed by the absorber 324. Accordingly, the possibility that the excitation light L1 will be reflected by the reflective substrate 21 and projected outward from the light-emitting device 1 can be reduced. The absorber 324 is formed by applying, by using a dispenser or the like, an organic solvent in which a black pigment is dispersed to an area around the phosphor layer 323.

The phosphor layer 323 contains a single type of phosphor that absorbs the excitation light L1 having a wavelength of about 450 nm and emits yellow fluorescence, or a plurality of types of phosphors that absorb the excitation light L1 having a wavelength of about 450 nm and emit green fluorescence and red fluorescence. White light is generated when the yellow fluorescence or the combination of the green fluorescence and the red fluorescence, which is emitted from the phosphor layer 23, is mixed with the blue excitation light L1.

With the structure of the light-emitting device 1 according to the present embodiment, since the wavelength of the excitation light L1 emitted from the laser unit 10 is about 450 nm, the Stokes' loss that occurs when the phosphors contained in the phosphor layer 323 are excited by the excitation light L1 and emit light can be reduced. Therefore, the theoretical luminous efficiency of the phosphor layer 323 can be increased. In addition, since white light is generated by combining the blue excitation light L1 with the yellow light, the phosphor layer 323 may be configured such that it contains only one type of phosphor which emits yellow fluorescence.

In the above-described light-emitting unit 320, the entire areas of the side surfaces of the phosphor layer 323 are covered only by the absorber 324. However, the absorber 324 is not limited to this as long as the absorber 324 is formed on the top surface such that a portion of the excitation light L1 that is incident on the light-emitting unit 320 at a position deviated from the phosphor layer 323 can be absorbed. Therefore, in a modification of the light-emitting unit 320, side surfaces of the phosphor layer 323 may be covered by a multilayer structure including a reflector and an absorber.

The structures of light-emitting units 320A and 320B according to modifications of the light-emitting unit 320 will now be described with reference to FIGS. 5B and 5C. FIGS. 5B and 5C are sectional views of the light-emitting units 320A and 320B, respectively. As illustrated in FIGS. 5B and 5C, the light-emitting unit 320A includes a reflective substrate 21, a phosphor layer 323, a reflector 322A, and an absorber 324A, and the light-emitting unit 320B includes a reflective substrate 21, a phosphor layer 323, a reflector 322B, and an absorber 324B. The reflectors 322A and 322B reflect fluorescence emitted from the phosphor layer 323. The absorbers 324A and 324B absorb excitation light L1 and the fluorescence.

Figure 5B:
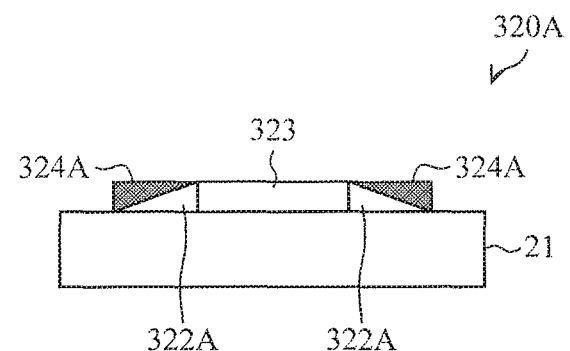
FIGS. 5B and 5C are sectional views illustrating modifications of the light-emitting unit.

As illustrated in FIG. 5B, when the light-emitting unit 320A is viewed from the outside, the periphery of the phosphor layer 323 is surrounded by the absorber 324A. Therefore, a portion of the excitation light L1 that is incident on the light-emitting unit 320A at a position deviated from the phosphor layer 323 is absorbed by the absorber 324A. In the light-emitting unit 320A, the thickness of the absorber 324A decreases and the thickness of the reflector 322A increases as the distance to each side surface of the phosphor layer 323 decreases. The side surfaces of the phosphor layer 323 are covered by the reflector 322A. Accordingly, the fluorescence emitted from the side surfaces of the phosphor layer 323 is reflected toward the inside of the phosphor layer 323 by the reflector 322A, and is not emitted to the outside of the phosphor layer 323 through the side surfaces. Therefore, the light emission pattern is prevented from being deformed by the fluorescence emitted from the side surfaces of the phosphor layer 323.

Figure 5C:
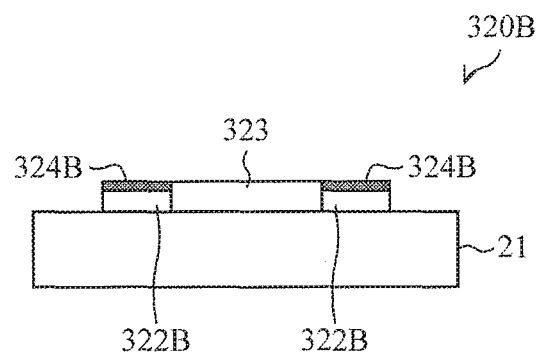

Referring to FIG. 5C, in the light-emitting unit 320B, the reflector 322B and the absorber 324B, which have uniform thicknesses, are stacked on the reflective substrate 21 in that order. Therefore, a portion of the excitation light L1 that is incident on the light-emitting unit 320B at a position deviated from the phosphor layer 323 is absorbed by the absorber 324B. The side surfaces of the phosphor layer 323 are partially covered by the reflector 322B. Therefore, a portion of the fluorescence emitted from the side surfaces of the phosphor layer 323 is reflected toward the inside of the phosphor layer 323 by the reflector 322B, and is not emitted to the outside of the phosphor layer 323 through the side surfaces. Therefore, the light emission pattern is prevented from being deformed by the fluorescence emitted from the side surfaces of the phosphor layer 323.

As described above, in the light-emitting unit 320A, the entire areas of the side surfaces of the phosphor layer 323 are covered by the reflector 322A. In the light-emitting unit 320B, the side surfaces of the phosphor layer 323 are partially covered by the reflector 322B, and the remaining areas of the side surfaces are covered by the absorber 324B. Thus, in the light-emitting units 320A and 320B, the fluorescence emitted from the side surfaces of the phosphor layer 323 is entirely or partially reflected toward the inside of the phosphor layer 323, and a portion of the reflected fluorescence is emitted through the front surface of the phosphor layer 323. Accordingly, the efficiency of utilization of the fluorescence emitted from the phosphor layer 323 can be increased.

Figure 6A:
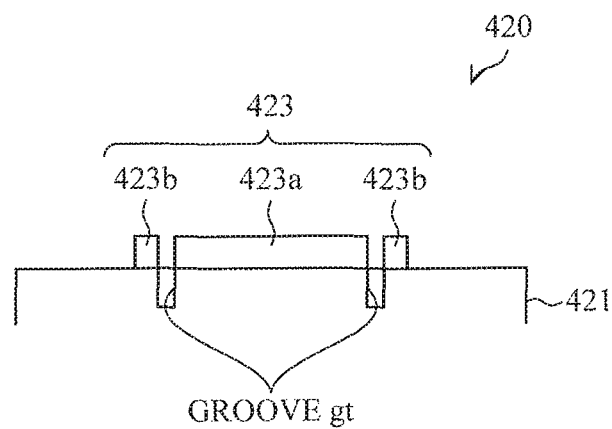
FIGS. 6A and 6B are a sectional view and a top view, respectively, of a light-emitting unit included in a light-emitting device according to another embodiment of the present disclosure.
Figure 6B:
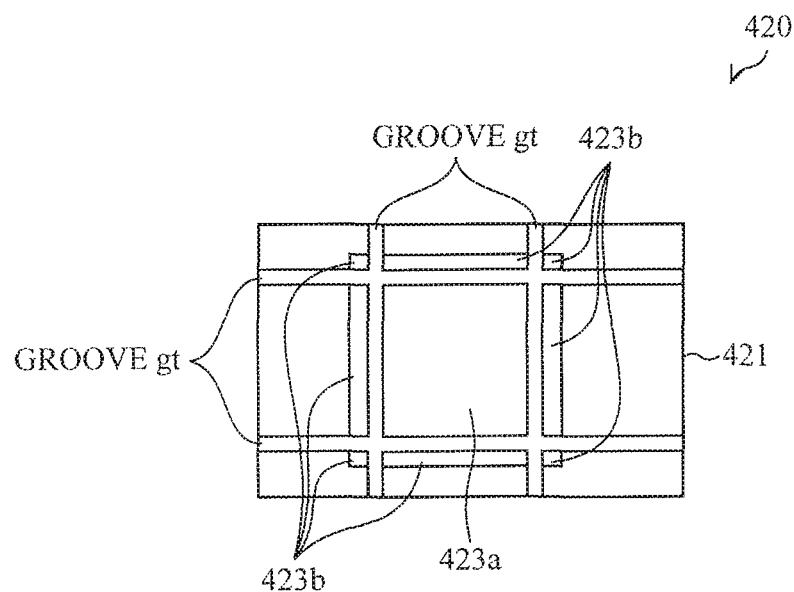

A fourth embodiment of the present disclosure will now be described with reference to FIGS. 6A and 6B. For convenience of description, components having the same functions as those described in the above-described embodiments are denoted by the same reference numerals, and descriptions thereof are thus omitted.

A light-emitting device 1 according to the present embodiment includes a light-emitting unit 420 instead of the light-emitting unit 20 in the structure illustrated in FIG. 2. Other structures are the same as those in the first embodiment.

The structure of the light-emitting unit 420 will now be described with reference to FIGS. 6A and 6B. FIGS. 6A and 6B are a sectional view and a top view, respectively, of the light-emitting unit 420. As shown in FIGS. 6A and 6B, four grooves gt are formed in the light-emitting unit 420. Each groove gt is deep enough to split a phosphor layer 423 and reach a reflective substrate 421. The four grooves gt define the region of a phosphor layer portion 423a to be irradiated with the excitation light L1. The positions of the four grooves gt are determined so that the phosphor layer portion 423a has the shape of the desired light emission pattern. Therefore, the phosphor layer 423 is formed so as to be larger than the desired light emission pattern. The grooves gt may be formed by using, for example, a dicing method.

To prevent phosphor layer portions 423b, which are portions disposed outside the grooves gt, from being irradiated with the excitation light L1, the edges of the beam of the excitation light L1 on the top surface of the phosphor layer 423 may be located in the grooves gt. Thus, the excitation light L1 is incident on the top surface of the phosphor layer 423 in a region which includes the entire region of the phosphor layer portion 423a surrounded by the grooves gt and which does not include the phosphor layer portions 423b outside the grooves gt.

In the light-emitting unit 420, the region of the phosphor layer portion 423a irradiated with the excitation light L1 (and the light emission pattern of the light-emitting unit 420) is defined by the grooves gt formed in the phosphor layer 423. Therefore, a light emission pattern having a high light/dark contrast at the boundaries defined by the grooves gt can be obtained. Referring to FIG. 6B, the grooves gt are provided at the four sides of the phosphor layer portion 423a. However, the grooves gt are not limited to this as long as they are provided at portions of the entire periphery of the phosphor layer portion 423a that defines the outline of the light emission pattern of the light-emitting unit 420, the portions corresponding to portions of the outline at which a high light/dark contrast is to be achieved.

Since it is not necessary to form the phosphor layer 423 in the shape of the light emission pattern, it is not necessary to perform precise control for forming the phosphor layer 423 in the shape of the light emission pattern. Therefore, a layer forming process for forming the phosphor layer 423 can be simplified.

In addition, since the light-emitting unit 420 is not required to have a reflector or an absorber as in the light-emitting unit 20 according to the above-described embodiments, the material cost can be reduced.

Figure 7:
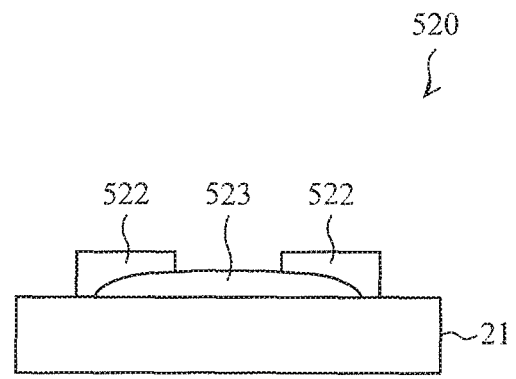
FIG. 7 is a sectional view of a light-emitting unit included in a light-emitting device according to another embodiment of the present disclosure.

A fifth embodiment of the present disclosure will now be described with reference to FIG. 7. For convenience of description, components having the same functions as those described in the above-described embodiments are denoted by the same reference numerals, and descriptions thereof are thus omitted.

In a manufacturing process of the light-emitting unit 20 according to the above-described embodiments, to form the top surface of the phosphor layer 23 in the shape of the light emission pattern, the phosphor layer 23 is formed so as to have steep edges. However, this requires an advanced control technique. To solve this problem, a light-emitting device 1 according to the present embodiment includes a light-emitting unit 520 instead of the light-emitting unit 20 in the structure illustrated in FIG. 2. Other structures are the same as those in the first embodiment.

The structure of the light-emitting unit 520 will now be described with reference to FIG. 7. FIG. 7 is a sectional view of the light-emitting unit 520. As illustrated in FIG. 7, the light-emitting unit 520 includes a reflective substrate 21, a reflector 522, and a phosphor layer 523. The reflector 522 and the phosphor layer 523 may be composed of the same materials as those of the reflector 22 and the phosphor layer 23, respectively, according to the above-described embodiments. In a modification of the present embodiment, an absorber that absorbs visible light may be used instead of the reflector 522.

In a manufacturing process of the light-emitting unit 520, first, the phosphor layer 523 is formed on the reflective substrate 21. It is not necessary to form the phosphor layer 523 in the shape of the light emission pattern as long as the phosphor layer 523 is larger than the light emission pattern. Next, the reflector 522 is formed on the phosphor layer 523. The reflector 522 is formed on the phosphor layer 523 such that it does not overlap a portion of the phosphor layer 523 that corresponds to the light emission pattern. As a result, after the reflector 522 is formed, the portion of the phosphor layer 523 that corresponds to the light emission pattern remains in a state such that it is not covered by the reflector 522. Alternatively, the reflector 522 may be formed so as to cover the entire area of the top surface of the phosphor layer 523, and then a hole having the shape of the light emission pattern may be formed in the reflector 522. In this case, a portion of the phosphor layer 523 having the shape of the light emission pattern is exposed at the hole formed in the reflector 522.

As described above, in the manufacturing process of the light-emitting unit 520, it is not necessary to form the phosphor layer 523 on the reflective substrate 21 so that the phosphor layer 523 has steep edges. Therefore, a light emission pattern having a high light/dark contrast may be obtained by a simple layer forming method.

Figure 8:
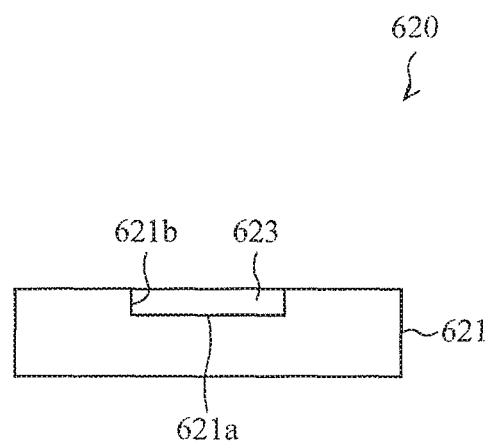
FIG. 8 is a sectional view of a light-emitting unit included in a light-emitting device according to another embodiment of the present disclosure.

A sixth embodiment of the present disclosure will now be described with reference to FIG. 8.

A light-emitting device 1 according to the present embodiment includes a light-emitting unit 620 instead of the light-emitting unit 20 in the structure illustrated in FIG. 2. Other structures are the same as those in the first embodiment.

The structure of the light-emitting unit 620 will now be described with reference to FIG. 8. FIG. 8 is a sectional view of the light-emitting unit 620. As illustrated in FIG. 8, the light-emitting unit 620 includes a reflective substrate 621 and a phosphor layer 623. The reflective substrate 621 and the phosphor layer 623 may be composed of the same materials as those of the reflective substrate 21 and the phosphor layer 23, respectively, according to the above-described embodiments.

The reflective substrate 621 has a recess 621a having the shape of the light emission pattern. Inner side surfaces 621b of the reflective substrate 621 that define the recess 621a are mirror-finished to increase the fluorescence reflectance thereof.

The phosphor layer 623 is formed in the recess 621a. Since the recess 621a has the shape of the light emission pattern as described above, the phosphor layer 623, which fills the recess 621a, also has the shape of the light emission pattern. The top surface of the phosphor layer 623 may be at the same height as the front surface of the reflective substrate 621, or lower than the front surface of the reflective substrate 621.

The side surfaces of the phosphor layer 623 are in contact with the inner side surfaces 621b of the recess 621a, and the inner side surfaces 621b are mirror-finished so that the fluorescence can be reflected. Therefore, the fluorescence emitted from the phosphor layer 623 toward the inner side surfaces 621b is reflected toward the inside of the phosphor layer 623 by the inner side surfaces 621b. As a result, loss of the fluorescence can be reduced, and the fluorescence can be emitted only from the top surface of the phosphor layer 623.

With the above-described structure of the light-emitting unit 620, it is not necessary to cover a region around the phosphor layer 623 with a reflector or an absorber, so that the material cost of the light-emitting unit 620 is reduced. In addition, the side surfaces and the bottom surface of the phosphor layer 623 are in contact with the reflective substrate 621, which has a high thermal conductivity, and a region of the phosphor layer 623 in which a maximum amount of heat is generated, that is, a region in which the phosphor layer 623 is irradiated with the excitation light L1, is near a heat sink that is connected to the reflective substrate 621. Therefore, the efficiency of heat dissipation from the phosphor layer 623 can be improved.

Figure 9A:
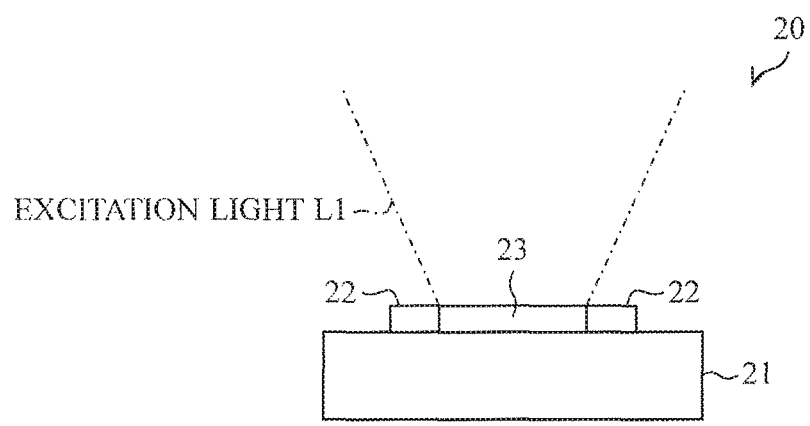
FIGS. 9A and 9B are a sectional view and a top view, respectively, of a light-emitting unit according to another embodiment of the present disclosure, illustrating the manner in which excitation light is incident on the light-emitting unit.
Figure 9B:
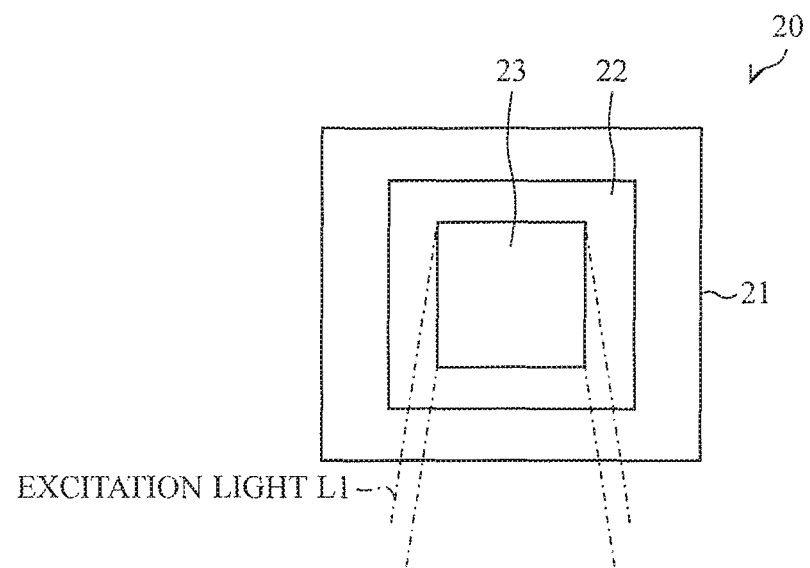

A seventh embodiment of the present disclosure will now be described with reference to FIGS. 9A and 9B. For convenience of description, components having the same functions as those described in the above-described embodiments are denoted by the same reference numerals, and descriptions thereof are thus omitted.

The structure of a light-emitting device 1 according to the present embodiment is the same as that of the light-emitting device 1 according to the first embodiment illustrated in FIG. 2. However, in the present embodiment, a region in which a phosphor layer 23 of a light-emitting unit 20 is irradiated with excitation light L1 differs from that in the first embodiment. The details of the difference will be described with reference to FIGS. 1A, 1B, 9A, and 9B. FIGS. 9A and 9B are a sectional view and a side view, respectively, of the light-emitting unit 20.

In the structure of the above-described embodiment illustrated in FIG. 1B, the beam size of the excitation light L1 on the front surface of the phosphor layer 23 is slightly larger than the front surface of the phosphor layer 23. In contrast, in the present embodiment, as illustrated in FIGS. 9A and 9B, the shape of an emission end face of a laser unit 10 and the structure of an optical member 30 are set so that the beam shape of the excitation light L1 on the front surface of the phosphor layer 23 completely coincides with the shape of the front surface of the phosphor layer 23.

With the structure of the present embodiment, all of the excitation light L1 emitted from the laser unit 10 is incident on the phosphor layer 23. Therefore, the luminous efficiency of the phosphor layer 23 with respect to the power consumption of the laser unit 10 can be increased.

Figure 10:
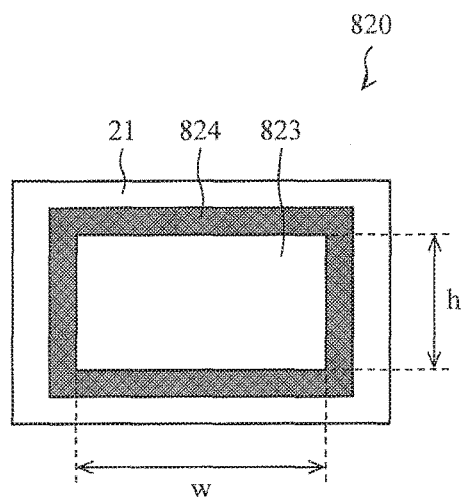
FIG. 10 is a sectional view of a light-emitting unit included in a light-emitting device according to another embodiment of the present disclosure.

An eighth embodiment of the present disclosure will now be described with reference to FIG. 10. For convenience of description, components having the same functions as those described in the above-described embodiments are denoted by the same reference numerals, and descriptions thereof are thus omitted.

A light-emitting device 1 according to the present embodiment includes a light-emitting unit 820 instead of the light-emitting unit 20 in the structure illustrated in FIG. 2. Other structures are the same as those in the first embodiment. The light-emitting unit 820 includes a reflective substrate 21, a phosphor layer 823, and an absorber 824. The phosphor layer 823 and the absorber 824 may be composed of the same materials as those of the phosphor layer 23 and the absorber 324, respectively, according to the above-described embodiments.

The shape of the light-emitting unit 820 is determined on the assumption that the light-emitting device 1 is used as a light source for a vehicle headlight having a horizontally wide light projection pattern. More specifically, the front surface of the phosphor layer 823 of the light-emitting unit 820 has a rectangular shape (h<w in FIG. 10). Therefore, the light emission pattern of the fluorescence emitted from the front surface of the phosphor layer 823 also has a rectangular shape. A horizontally wide light projection pattern can be obtained by using the rectangular light emission pattern.

The horizontally wide light projection pattern may be obtained by forming the phosphor layer 823 such that the phosphor layer 823 itself has the shape of the light projection pattern. Alternatively, the horizontally wide light projection pattern may instead be obtained by forming the phosphor layer 823 in an arbitrary shape and then forming a reflector or an absorber so as to cover a portion of the top surface and the side surfaces of the phosphor layer 823 such that a portion of the phosphor layer 823 having the shape of the light projection pattern is exposed.

The beam shape of the excitation light L1 on the top surface of the phosphor layer 823 is not limited as long as the entire area of the top surface of the phosphor layer 823 (exposed portion that is not covered by the absorber 824) can be irradiated with the excitation light L1. From the viewpoint of increasing the conversion efficiency with which the excitation light L1 is converted into the fluorescence and allowing the entire area of the phosphor layer 823 to be irradiated with the excitation light L1 even when the excitation light L1 is shifted in any direction, the beam shape of the excitation light L1 may be a rectangular shape that extends beyond the periphery of the top surface of the phosphor layer 823 by a constant distance in both the longitudinal and lateral directions.

Figure 11:
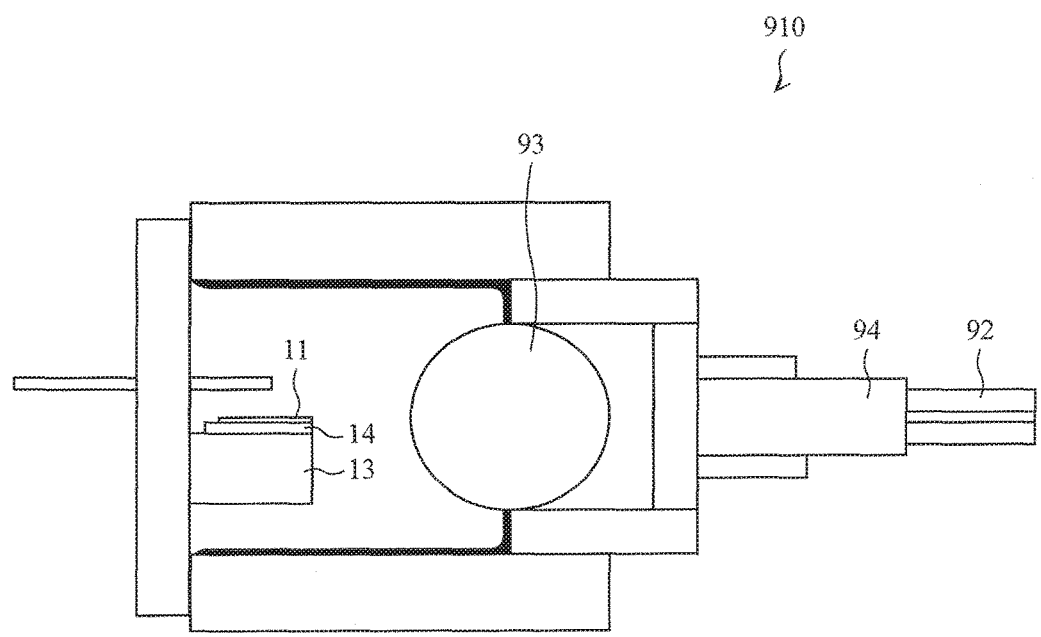
FIG. 11 is a schematic diagram illustrating the structure of a laser unit included in a light-emitting device according to another embodiment of the present disclosure.

A ninth embodiment of the present disclosure will now be described with reference to FIG. 11. For convenience of description, components having the same functions as those described in the above-described embodiments are denoted by the same reference numerals, and descriptions thereof are thus omitted.

A light-emitting device 1 according to the present embodiment includes a laser unit 910 instead of the laser unit 10 in the structure illustrated in FIG. 2. Other structures are the same as those in the first embodiment.

The structure of the laser unit 910 will now be described with reference to FIG. 11. FIG. 11 is a sectional view of the laser unit 910. As illustrated in FIG. 11, the laser unit 910 includes a multimode fiber (light guide) 92 instead of the light guide 12 in the structure of the laser unit 10 illustrated in FIG. 3. The multimode fiber 92 is attached to the exterior of the main body of the laser unit 910 with a ferrule 94. A ball lens 93 focuses excitation light L1 emitted from a laser chip 11 on an incident end of the multimode fiber 92. Other structures of the laser unit 910 are the same as those of the laser unit 10.

The excitation light L1 emitted from the laser chip 11 passes through the ball lens 93, and is incident on the multimode fiber 92. The excitation light L1 travels through the multimode fiber 92 while being repeatedly reflected in the core. Therefore, the excitation light L1 has a top-hat energy intensity distribution at an emission end face of the multimode fiber 92.

With the structure of the laser unit 910 according to the present embodiment, since the multimode fiber 92 is provided, the distance by which the excitation light L1 is guided can be increased compared to those in the structures according to the above-described embodiments which include the rod lens 12a. When the distance by which the excitation light L1 is guided is increased, the number of times the excitation light L1 is reflected in the core of the multimode fiber 92 increases. As a result, the excitation light L1 has a very uniform intensity distribution at the emission end face.

In addition, the multimode fiber 92 is flexible. Therefore, the direction in which the excitation light L1 is guided can be easily changed by changing the shape of the multimode fiber 92. Accordingly, the degree of freedom of arrangement of the laser unit 910 can be increased.

Figure 12:
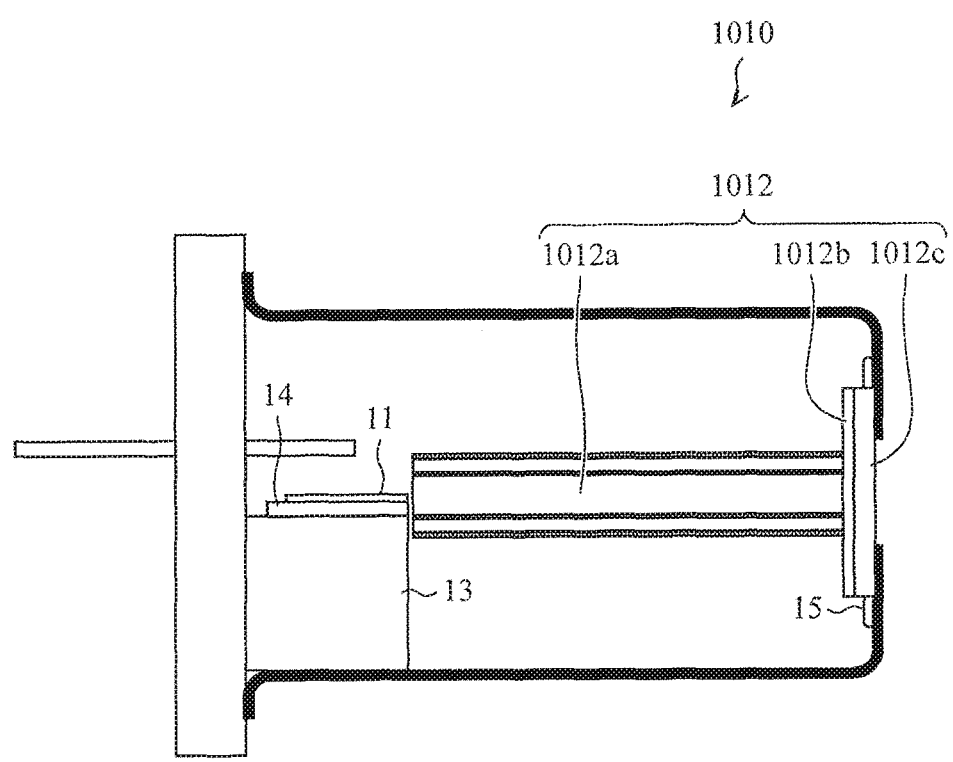
FIG. 12 is a schematic diagram illustrating the structure of a laser unit included in a light-emitting device according to another embodiment of the present disclosure.

A tenth embodiment of the present disclosure will now be described with reference to FIG. 12. For convenience of description, components having the same functions as those described in the above-described embodiments are denoted by the same reference numerals, and descriptions thereof are thus omitted.

A light-emitting device 1 according to the present embodiment includes a laser unit 1010 instead of the laser unit 10 in the structure illustrated in FIG. 2. Other structures are the same as those in the first embodiment.

The structure of the laser unit 1010 will be described with reference to FIG. 12. FIG. 12 is a sectional view of the laser unit 1010. As illustrated in FIG. 12, the laser unit 1010 includes a light guide 1012 instead of the light guide 12 in the structure of the laser unit 10 illustrated in FIG. 3. Other structures of the laser unit 1010 are the same as those of the laser unit 10.

The light guide 1012 includes a hollow pipe 1012a, an AR coating film 1012b, and a cap glass 1012c. The hollow pipe 1012a has the shape of a hollow rectangular tube. The inner surfaces of the hollow pipe 1012a that define the hollow space are formed as mirror surfaces. The excitation light L1 passes through the hollow pipe 1012a while being repeatedly reflected by the mirror surfaces of the hollow pipe 1012a. As a result, the excitation light L1 has a top-hat intensity distribution at the emission end face of the hollow pipe 1012a.

The cap glass 1012c is provided at the emission end of the hollow pipe 1012a with the AR coating film 1012b interposed therebetween. The AR coating film 1012b prevents the excitation light L1 that has passed through the hollow pipe 1012a from being reflected by the cap glass 1012c.

With the structure of the laser unit 1010 according to the present embodiment, the optical coupling between the hollow pipe 1012a and the excitation light L1 emitted from the laser chip 11 has a very large tolerance. Therefore, no precise alignment is needed, and the laser unit 1010 is highly resistant to vibration.

Figure 13:
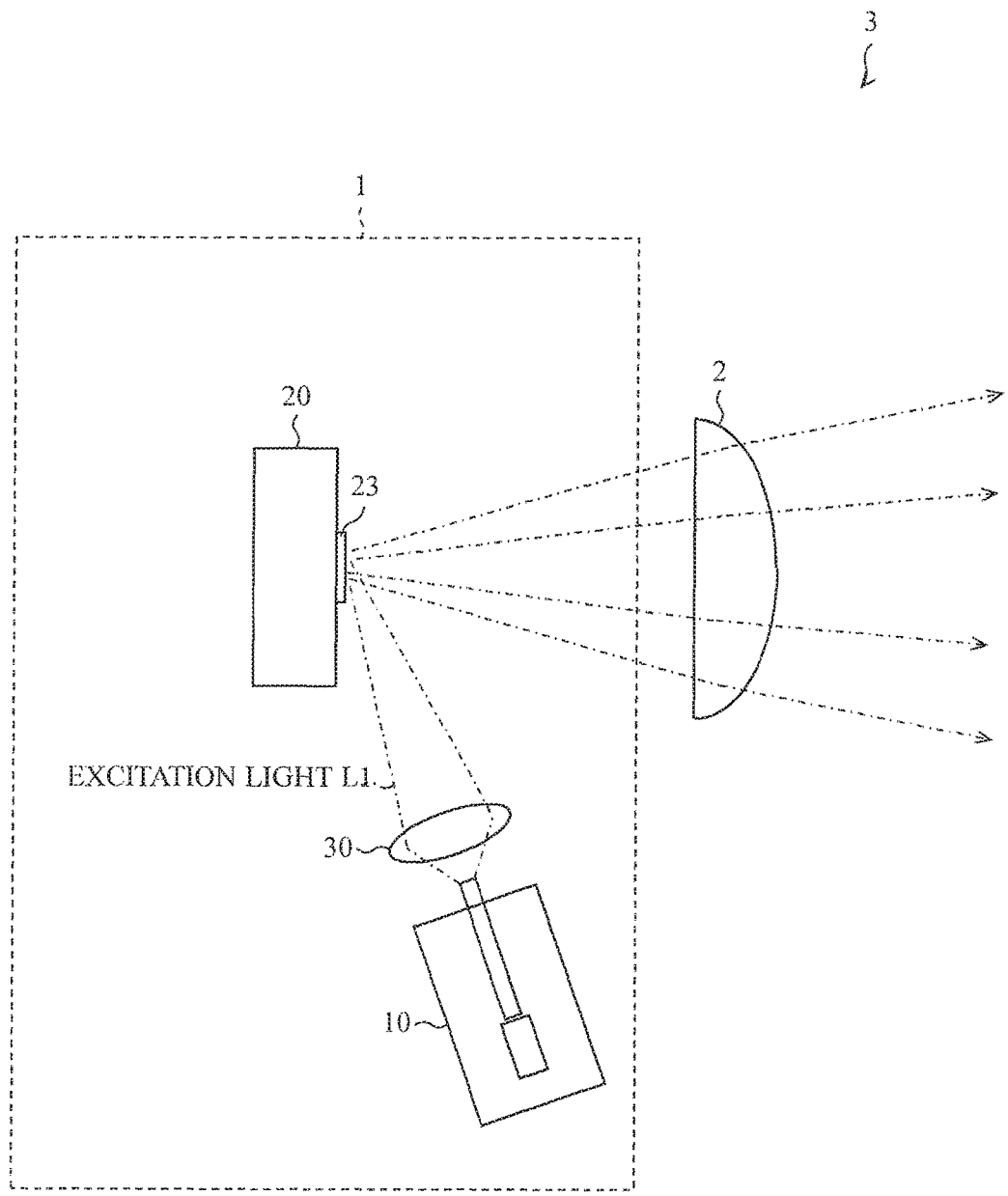
FIG. 13 is a schematic diagram illustrating the structure of a vehicle headlight according to an embodiment of the present disclosure.

An eleventh embodiment of the present disclosure will now be described with reference to FIG. 13. For convenience of description, components having the same functions as those described in the above-described embodiments are denoted by the same reference numerals, and descriptions thereof are thus omitted.

In the present embodiment, a vehicle headlight 3 includes a light-emitting device 1 illustrated in FIG. 2 as a light source. The structure of the light-emitting device 1 may instead be those of the light-emitting devices (or the light-emitting device 1') according to other embodiments. The number of light-emitting devices 1 included in the vehicle headlight 3 may be one or more, and any number can be selected to achieve the required luminous flux.

The structure of the vehicle headlight 3 will now be described with reference to FIG. 13. FIG. 13 is a schematic diagram illustrating the structure of the vehicle headlight 3. As illustrated in FIG. 13, the vehicle headlight 3 includes the light-emitting device 1 according to any of the above-described embodiments and a projecting portion 2. The projecting portion 2 projects light emitted from the light-emitting unit 20 (phosphor layer 23) of the light-emitting device 1 in a desired direction and in a desired shape.

In the light-emitting device 1, the optical member 30 and the laser unit 10 are disposed at a position deviated from a region in front of the light-emitting unit 20, and excitation light L1 is obliquely incident on the front surface of the light-emitting unit 20. Accordingly, the fluorescence emitted from the light-emitting unit 20 (phosphor layer 23) is not blocked by the optical member 30 or the laser unit 10. The optical member 30 focuses an image of the excitation light L1 from the laser unit 10 on the top surface of the phosphor layer 23, the image being an image existing at an emission end face of the laser unit 10. Therefore, the excitation light L1 having a uniform intensity distribution is incident on the phosphor layer 23. As a result, the phosphor layer 23 emits the fluorescence having a high light/dark contrast at the boundaries defined by the edges (peripheral edges) between the phosphor layer 23 and the reflector 22 surrounding the phosphor layer 23.

The vehicle headlight 3 includes the light-emitting device 1 as a light source. As described above, the light-emitting unit 20 of the light-emitting device 1 emits fluorescence having a uniform, high light/dark contrast light emission pattern. Therefore, the distribution pattern of the light projected by the projecting member 2 can be accurately controlled. The vehicle headlight 3 is capable of emitting light having a specific shape, such as the shape of a light distribution pattern for a low-beam that is determined by law.

A light-emitting device according to an aspect of the present disclosure includes a light-emitting portion that emits fluorescence in response to excitation light incident on a surface of the light-emitting portion; and a light-emitting-region defining portion that defines a light-emitting region on the surface of the light-emitting portion, the fluorescence being emitted from the light-emitting region. The excitation light has a top-hat energy intensity distribution on the surface of the light-emitting portion.

With the above-described structure, the light-emitting region which the fluorescence is emitted from in the light-emitting portion is defined by the light-emitting-region defining portion. The light-emitting portion emits the fluorescence only from the light-emitting region defined by the light-emitting-region defining portion. The excitation light having a top-hat energy intensity distribution is incident on the light-emitting portion in the light-emitting region. Therefore, the energy of the excitation light received by the light-emitting portion is substantially uniform over the entire area of the light-emitting region. As a result, the intensity of the fluorescence emitted from the light-emitting portion is also substantially uniform over the light-emitting region. Thus, fluorescence having a uniform brightness can be obtained.

In addition, since the energy of the excitation light incident on the light-emitting portion is substantially uniform over the light-emitting region, local increase in temperature on the surface of the light-emitting portion due to the energy of the excitation light can be suppressed. As a result, a phosphor contained in the light-emitting portion can be prevented from temperature quenching in a local area.

According to a second aspect of the present disclosure, in the light-emitting device according to the first aspect, the light-emitting-region defining portion may include a blocking portion that prevents the fluorescence from being emitted from a side surface of the light-emitting portion.

With this structure, the fluorescence having a light emission pattern is emitted from a top surface of the light-emitting portion, and the fluorescence that reaches the side surface of the light-emitting portion and that is irrelevant to the light emission pattern is blocked by the blocking portion and is not emitted. Therefore, an accurate light emission pattern can be formed. The blocking portion may block the fluorescence by absorbing or reflecting the fluorescence.

According to a third aspect of the present disclosure, in the light-emitting device according to the first or second aspect, the light-emitting-region defining portion may cover a portion of the light-emitting portion.

With this structure, a portion of the light-emitting portion is covered by the light-emitting-region defining portion. For example, the light-emitting-region defining portion may partially cover the light-emitting portion such that a portion of the light-emitting portion having the shape of the light emission pattern is exposed. In this case, it is not necessary to form the light-emitting portion such that the light-emitting portion has the shape of the light emission pattern in advance.

According to a fourth aspect of the present disclosure, in the light-emitting device according to the first aspect, the light-emitting-region defining portion may be a groove formed in a region outside the light-emitting region.

With this structure, the fluorescence having a light emission pattern is emitted from the light-emitting region, and the fluorescence that is emitted from the side surface of the light-emitting region and that is irrelevant to the formation of light emission pattern is diffused by the groove. Therefore, an accurate light emission pattern can be formed.

According to a fifth aspect of the present disclosure, the light-emitting device according to any one of the second to fourth aspects may further include an excitation light source that emits the excitation light, a light guide that guides the excitation light from the excitation light source to the light-emitting portion, and an optical member that focuses an image of the excitation light guided by the light guide on the surface of the light-emitting portion, the image being an image existing at an emission end face of the light guide.

With this structure, the excitation light emitted from the excitation light source passes through the light guide and is incident on the surface of the light-emitting portion. The optical member focuses the image of the excitation light at the emission end of the light guide on the surface of the light-emitting portion. Accordingly, the excitation light having a high light/dark contrast at the boundary defined by the periphery of the image is incident on the surface (light emitting region) of the light-emitting portion. As a result, fluorescence having a high light/dark contrast at the boundary defined by the periphery of the light-emitting region can be generated.

The present disclosure is not limited to the above-described embodiments, and various modifications are possible within the scope of the claims. An embodiment obtained by appropriately combining technical means disclosed in different embodiments is also included in the technical scope of the present disclosure. Also, a new technical feature may be obtained by combining technical means disclosed in the embodiments.

The present disclosure is applicable to various illuminating devices, in particular, a vehicle headlight.

It should be understood by those skilled in the art that various modifications, combinations, sub-combinations and alterations may occur depending on design requirements and other factors insofar as they are within the scope of the appended claims or the equivalents thereof.

The invention claimed is:

1. A light-emitting device comprising:
    a transparent substrate;
    a light-emitting unit which is disposed to be in contact with a first surface of the transparent substrate and which emits fluorescence from a light-emitting surface thereof in response to reception of excitation light;
    a reflector which is formed in contact with a side surface of the light-emitting unit; and
    an optical element which faces a second surface of the transparent substrate, the second surface being located opposite to the first surface of the transparent substrate, and which causes an intensity distribution of the excitation light to be less nonuniform,
    wherein after the excitation light travels through the optical element and the transparent substrate, the excitation light enters a contact surface of the light-emitting unit, wherein the contact surface is in contact with the first surface of the transparent substrate.

2. The light-emitting device according to claim 1, wherein the fluorescence emitted by the light-emitting unit is used as illumination light.

3. The light-emitting device of claim 1, further comprising:
   a convex lens which is disposed at a side of the transparent substrate, the side being located opposite to the light-emitting unit, and which focuses the excitation light on the light-emitting unit.

\* \* \* \* \*